United States Patent
Ng et al.

(10) Patent No.: US 9,437,804 B2
(45) Date of Patent: Sep. 6, 2016

(54) ELECTROACTIVE POLYMER STRUCTURES PRINTED WITH VARYING COMPOSITIONS OF IONS

(71) Applicant: Palo Alto Research Center Incorporated, Palo Alto, CA (US)

(72) Inventors: Tse Nga Ng, Palo Alto (HK); Kye-Si Kwon, Seoul (KR)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 599 days.

(21) Appl. No.: 13/966,060

(22) Filed: Aug. 13, 2013

(65) Prior Publication Data

US 2015/0048714 A1    Feb. 19, 2015

(51) Int. Cl.
*H01L 41/00*  (2013.01)
*H02N 2/00*  (2006.01)
*H01L 41/09*  (2006.01)
*H01L 41/193*  (2006.01)

(52) U.S. Cl.
CPC ....... *H01L 41/0933* (2013.01); *H01L 41/0926* (2013.01); *H01L 41/0946* (2013.01); *H01L 41/0953* (2013.01); *H01L 41/193* (2013.01); *Y10T 29/49117* (2015.01)

(58) Field of Classification Search
CPC ... F03G 7/005; H01L 41/08; H01L 41/0926; H01L 41/193

USPC .............. 29/592.1, 825; 310/300, 311, 365
See application file for complete search history.

(56) References Cited

U.S. PATENT DOCUMENTS

| | | | |
|---|---|---|---|
| 7,315,106 B2 | 1/2008 | Asaka et al. | |
| 8,172,998 B2 | 5/2012 | Bennett et al. | |
| 2013/0181572 A1* | 7/2013 | Hino | F03G 7/005 310/311 |

OTHER PUBLICATIONS

Fukushima, et al., "Fully plastic actuator through layer-by-layer casting with ionic liquid based bucky gel." Angew. Chem. Int. Ed., 2005, 44, pp. 2410-2413. Doi: 10.1002/anie.200462318.

T. Sekitani and T. Someya, "Stretchable, large-area organic electronics," Adv. Mater. 2010, 22, pp. 2228-2246. Doi: 10.1002/adma.200904054.

Bar-Cohen Y., "Electroactive Polymer (EAP) Actuators as Artificial Muscles—Reality, Potential and Challenges," Chapter 14, 2nd Edition, ISBN 0-8194-5297-1, SPIE Press, vol. PM136, (Mar. 2004).

* cited by examiner

*Primary Examiner* — Khanh Tuan Nguyen
(74) *Attorney, Agent, or Firm* — Marger Johnson

(57) ABSTRACT

An electroactive polymer structure includes a first flexible electrode, a second flexible electrode, and a polymer dielectric layer with ionic liquid on top of the first electrode including at least two regions. Each region of the polymer dielectric layer includes a different ionic liquid concentration. The polymer dielectric layer is in between the first flexible electrode and the second flexible electrode.

20 Claims, 6 Drawing Sheets

US 9,437,804 B2

ELECTROACTIVE POLYMER STRUCTURES PRINTED WITH VARYING COMPOSITIONS OF IONS

BACKGROUND

Electroactive polymer structures are used as actuators in haptic interfaces, conformal lens wipers, mounts for minor arrays, fluid valves or pumps, and many other electromechanical applications. Electroactive polymer structures using ionic liquid as the actuation mechanism have an advantage of low voltage operation compared to ferroelectric or electrostatic actuators.

DETAILED DESCRIPTION OF THE EMBODIMENTS

Figure 1:
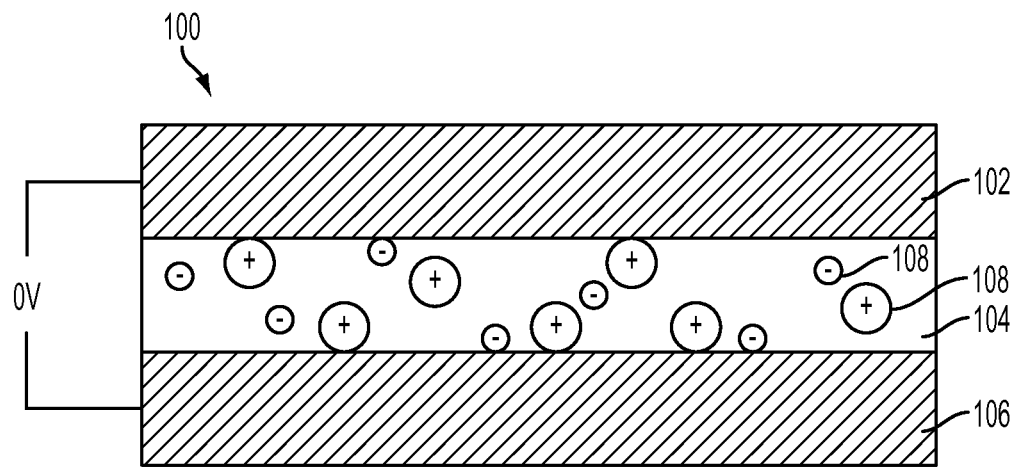
FIG. 1 shows a cross-section view of an electroactive polymer structure without a bias applied.
Figure 2:
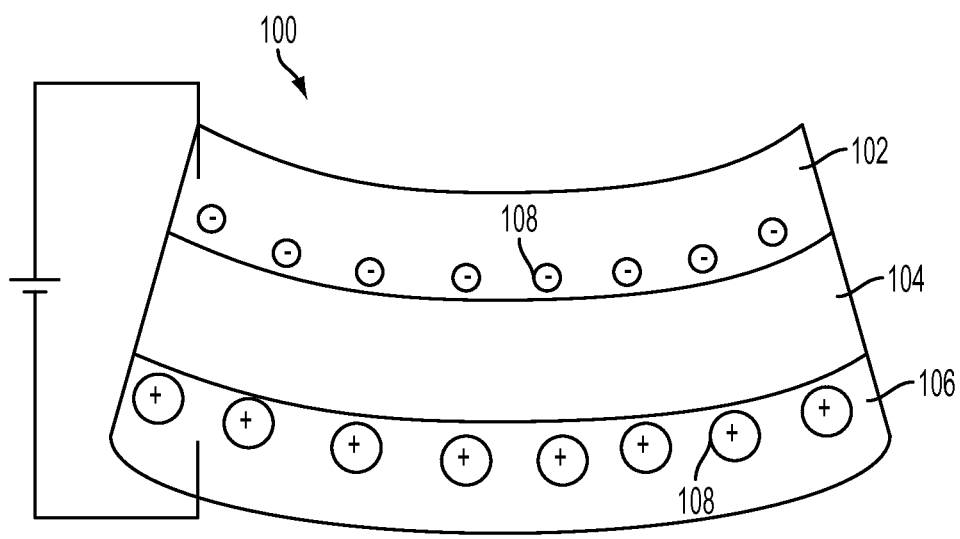
FIG. 2 shows a cross-section view of the electroactive polymer structure with a bias applied.

FIGS. 1 and 2 show an electroactive polymer structure 100. The electroactive polymer structure 100 is composed of at least three layers. The first layer is a flexible electrode 102. The second layer is a polymer dielectric layer 104. The third layer is another flexible electrode 106.

A solution of carbon particles with a polymer binder form the flexible electrodes 102 and 106 by extrusion or layer deposition. The electrodes may also contain metal conductive particles and ionic liquids. The carbon particles may be, for example, nanotubes, grapheme, etc. The carbon particles should be at approximately 15% loading. The polymer binder may be poly(vinylidene fluoride-co-hexafluoropropene (PVDF-HFP) or polydimethylsiloxane (PDMS).

A solution mixture of PVDF-HFP with an ionic liquid forms the polymer dielectric layer 104. The ionic liquid may be 1-ethyl-3-methylimidazolium tetrafluoroborate (EMI-BF4) or 1-butyl-3-methyl-imidazolium bis(trifluoromethanesulfonyl)imide (BMI-TFSI) with a weight ratio ranging from 0 to 150%, for example. The flexible electrodes 102 and 106 and the polymer dielectric layer 104 are dried at elevated temperature, such as 80° C., or in vacuum, after each layer is deposited.

In FIG. 1, a voltage has not been applied to the electroactive polymer structure 100. In FIG. 2, however, a bias has been applied and the electroactive polymer structure 100 becomes deformed. More specifically, the electroactive polymer structure 100 takes on a strained or curled structure, as seen in FIG. 2.

Upon applying the bias, the ions 108 in the ionic liquid of the polymer dielectric layer 104 migrate toward the flexible electrodes 102 and 106. The sizes of the cations and anions are substantially different. The polymer dielectric layer 104 expands more on the cation side than the anion side due to the cations being larger. The larger expansion on the cation side causes the polymer dielectric layer 104 and the flexible electrodes 102 and 106 to have the strained or curled structure.

The concentration of the ionic liquid in the polymer dielectric layer 104 can be varied. The concentration of the ionic liquid can be anywhere between 30% and 150%. Below 30% concentration the electroactive polymer structure 100 becomes hard to laminate. Above 150% concentration and the electroactive polymer structure 100 tends to delaminate.

Adjusting concentrations of the ionic liquid results in a different strain put on the electroactive polymer structure 100. When more cations migrate toward the flexible electrode, the electroactive polymer structure 100 will have a higher curvature. Further, adjusting the concentration of ionic liquid can also tune the strain versus frequency response of the electroactive polymer structure 100.

Figure 3:
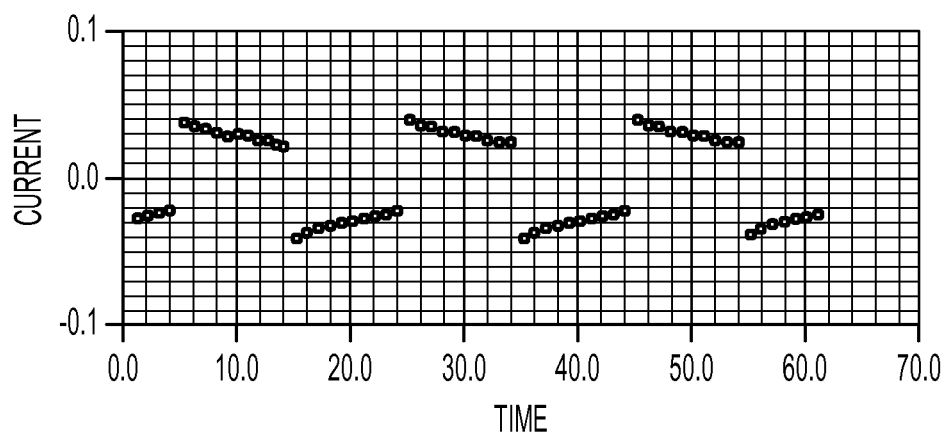
FIGS. 3 and 4 show a current response upon applying a bias to electroactive polymer structures.
Figure 4:
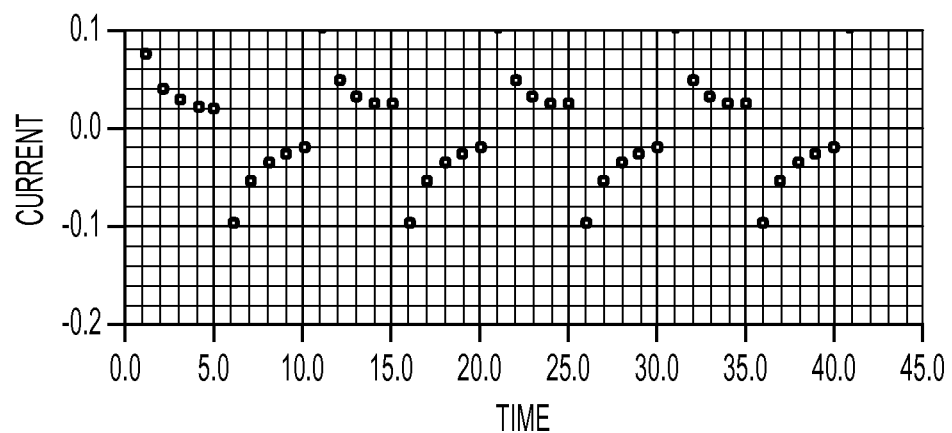

FIGS. 3 and 4 show a current response, in units of mA, upon applying a 4V square pulse to the electroactive polymer structure 100. FIG. 3 shows when the polymer dielectric layer 104 includes a 20% concentration of ionic liquid and FIG. 4 shows when the polymer dielectric layer 104 includes a 70% concentration of ionic liquid. As can be seen in FIGS. 3 and 4, a higher concentration of ionic liquid in the polymer dielectric layer leads to a stronger response in the electroactive polymer structure 100. The response time of deformation in the electroactive polymer structure 100 correlates to the rate of change in current.

Figure 5:
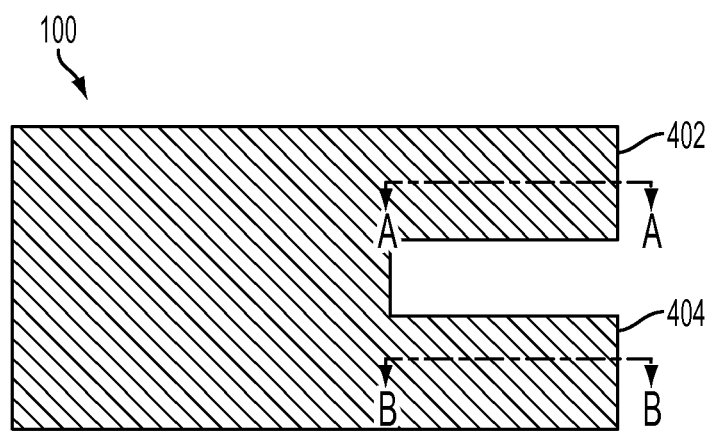
FIG. 5 shows a planar view of an electroactive polymer structure with two cantilevers.

Since the materials are all solution processable, each layer of the electroactive polymer structure 100 can be patterned by digital printing. This allows the electroactive polymer structure 100 to be built layer-by-layer. Using this method, the composition of the electroactive polymer structure 100 can vary laterally in each layer, as seen in FIG. 5.

Figure 6:
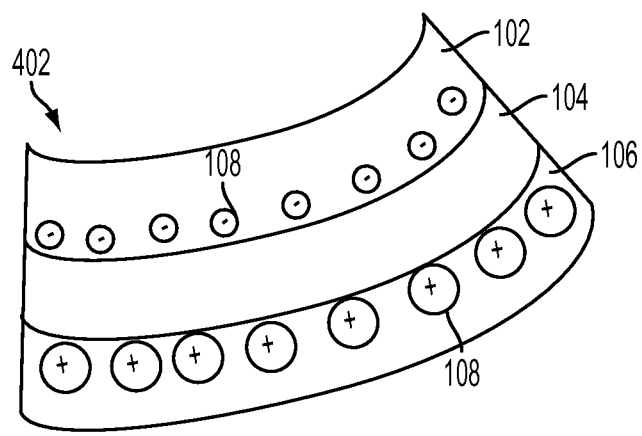
FIG. 6 shows a cross-section view of one of the cantilevers from FIG. 5.
Figure 7:
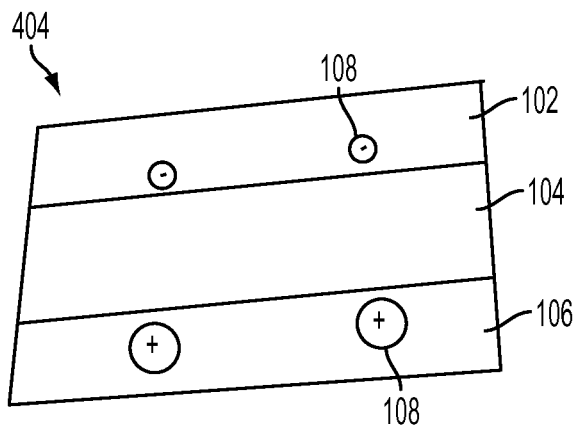
FIG. 7 shows a cross-section view of the other cantilever from FIG. 5.

The flexible electrodes and dielectric layer discussed above can also be patterned by subtractive processes such as lithography and laser cutting. Then, the flexible electrodes and the dielectric layer can be laminated together. Complex electroactive polymer structures, such as those including control electronics, are preferably fabricated using a layer-by-layer process. Non-electroactive materials can be incorporated within the electroactive polymer structure. For example, the electroactive polymer structure can include structural support materials or electronic control materials FIG. 5 shows an electroactive polymer structure 400 with two cantilevers 402 and 404. Each of the cantilevers 402 and 404 contain different concentrations of the ionic liquid in the polymer dielectric layer 104. FIG. 6 illustrates the cross-section of A-A in FIG. 5. Cantilever 402 has a larger curvature with an applied bias because there are more anions and cations. Therefore, that cantilever in FIG. 6 has a stronger curling action that the cross-section B-B shown in FIG. 7, which has a lower concentration of anions and cations and therefore will actuate with a smaller curvature at the same bias. Although FIG. 5 shows only two regions with different concentrations of ionic liquid, one skilled in the art will readily appreciate that more than two regions can vary the concentration of ionic liquid.

Figure 8:
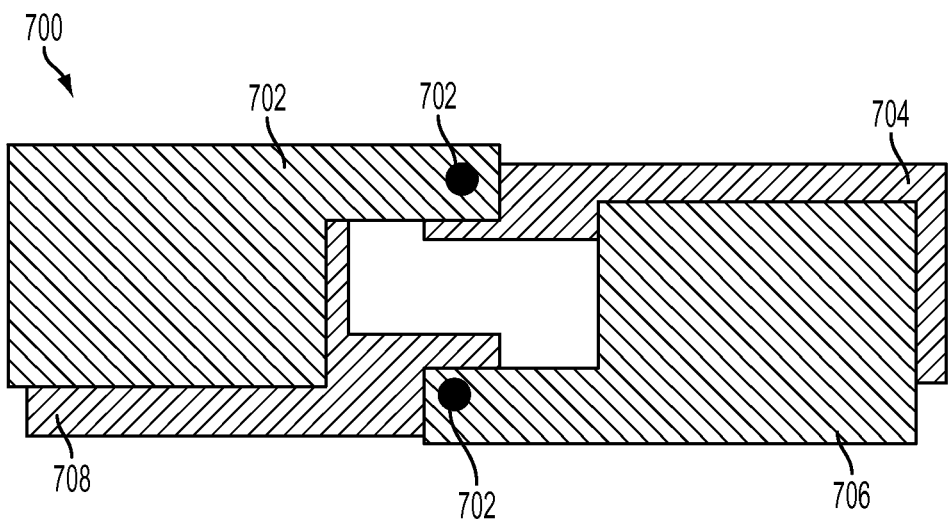
FIG. 8 shows an electroactive polymer structure according to embodiments of the disclosed technology.
Figure 9:
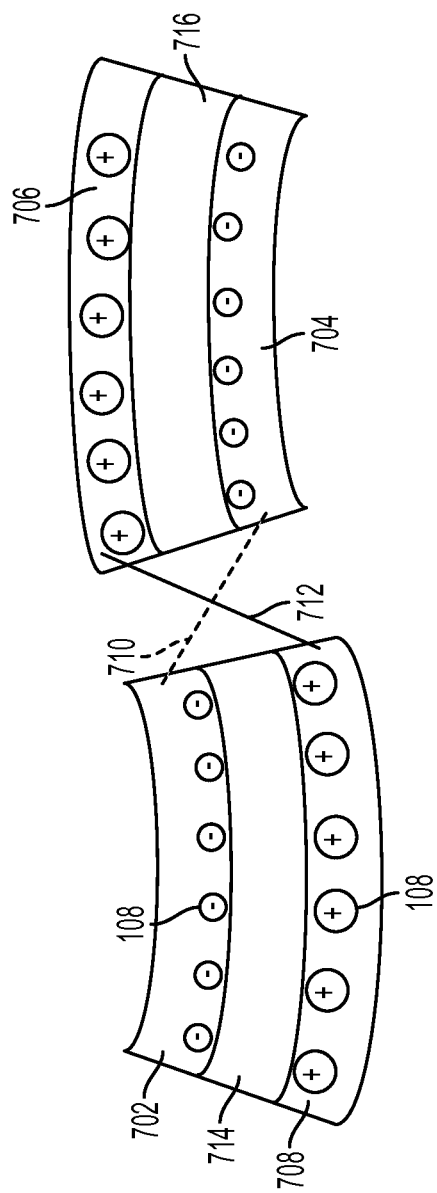
FIG. 9 shows a cross-section view of the electroactive polymer structure of FIG. 8 when a bias is applied.

With the deformation of the polymer dielectric layer 104, other shapes of the electroactive polymer structure can be made when a voltage is applied, as shown in with electroactive polymer structure 700 in FIGS. 8 and 9. To create the "S"-shape as seen in FIG. 9, a top electrode 702 on the left is connected to the bottom electrode 704 on the right. Then, the top electrode 706 on the right is connected to the bottom electrode 708 on the left. The electrodes are connected by vias 710 and 712 as seen in FIG. 9.

Since the top left electrode 702 and the bottom right electrode 704 are connected, when a bias is applied, all of either the anions or cations in the polymer dielectric layers 714 and 716 will migrate towards those layers. In FIG. 9, it is shown that the anions have moved toward the top left electrode 702 and the bottom right electrode 704, since they are connected through via 710. The cations in FIG. 9 have moved toward the top right electrode 706 and the bottom left electrode 708 since they are connected through via 712.

As will be readily understood by one skilled in the art, each of the regions are tailored for different actuation ranges by turning the ionic liquid concentration in the different regions. For example, with different ionic liquid concentration, the left top electrode 702 and the left bottom electrode 708 would deform more than the right top electrode 706 and the right bottom electrode 704. Accordingly, different concentrations of ionic liquid concentration lead to different strains.

Figure 10:
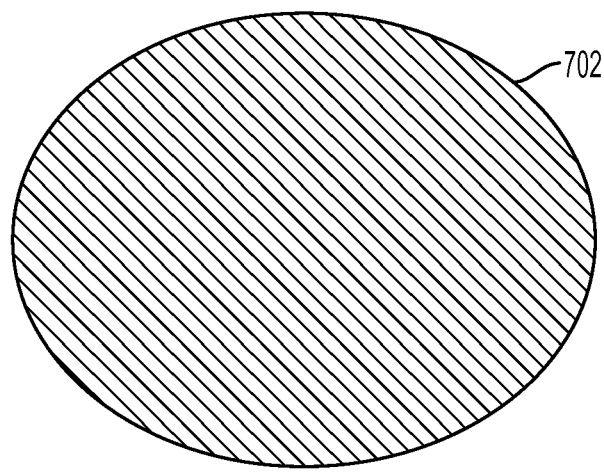
FIG. 10 shows a planar view of a circular electroactive polymer structure according to other embodiments of the disclosed technology.
Figure 11:
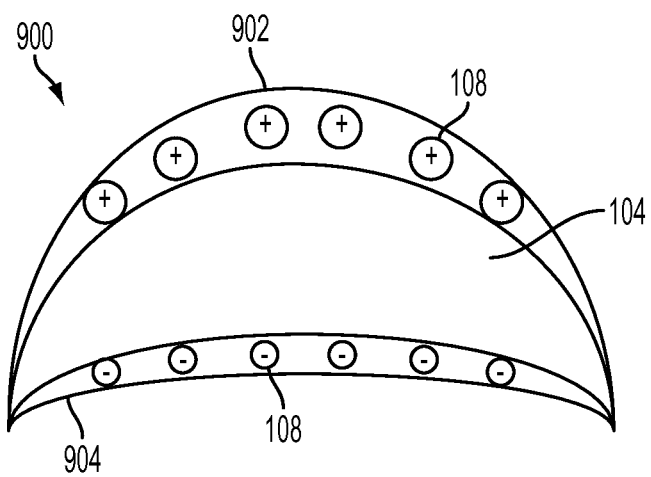
FIG. 11 shows a cross-section view of the circular electroactive polymer structure of FIG. 10 when a bias is applied.

Other variations and modifications exist. For example, other shapes can be made from the electroactive polymer structures. For example, as shown in FIGS. 10 and 11, a circular electroactive polymer structure 900 can be provided. When an electrical bias is applied, the electroactive polymer structure 900 takes on the shape of a dome. Again, since the cations are larger than the anions, the top electrode 902 deforms more than the bottom electrode 904 to which the anions are attracted. As will be understood by one skilled in the art, other geometric shapes can be made using the electroactive polymer structure.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. An electroactive polymer structure, comprising:
   a first flexible electrode including ionic liquid;
   a second flexible electrode including ionic liquid; and
   a polymer dielectric layer with ionic liquid including at least two regions, each region having a different ionic liquid concentration, wherein the polymer dielectric layer is in between the first flexible electrode and the second flexible electrode.

2. The electroactive polymer structure of claim 1, wherein a concentration of ionic liquid in the polymer dielectric layer and electrode layer is between 30% and 150%.

3. The electoractive polymer structure of claim 1, wherein the electroactive polymer structure is laminated.

4. The electroactive polymer structure of claim 1, wherein the polymer dielectric layer is a mixture of poly(vinylidene fluoride-co-hexafluoropropene) (PVDF-HFP) and an ionic liquid.

5. The electroactive polymer structure of claim 4, wherein the ionic liquid is 1-ethyl-3-methylimidaxolium tetrafluoroborate (EMI-BF4) or 1-butyl-3-methyl-imidazolium bis(trifluoromethanesulfonyl)imide (BMI-TFSI).

6. The electroactive polymer structure of claim 1, wherein the electroactive polymer structure is an actuator.

7. The electroactive polymer structure of claim 1, wherein the electroactive polymer structure is manufactured using a digital printing process.

8. The electroactive polymer structure of claim 1, wherein the electroactive polymer structure deforms in response to an input voltage.

9. The electroactive polymer structure of claim 1, wherein the electroactive polymer structure includes two cantilevers, each cantilever is the region having the different ionic liquid concentration.

10. A method of forming an electroactive polymer structure, comprising:
    forming a first electrode layer by extruding the first flexible electrode layer from a solution of carbon particles with a polymer binder and ionic liquid to form a first flexible electrode layer;
    forming a second flexible electrode layer by extruding the second flexible electrode layer from a solution of carbon particles with a polymer binder and ionic liquid to form a first flexible electrode layer; and
    forming a polymer dielectric layer in between the first flexible electrode and the second flexible electrode from a solution mixture of poly(vinylidene fluoride-co-hexafluoropropene) (PVDF-HFP) with an ionic liquid, such that the polymer dielectric layer includes two regions, each region having a different ionic liquid concentration.

11. The method of forming the electroactive polymer structure of claim 10, further comprising drying each layer at an elevated temperature or in vacuum.

12. The method of forming the electroactive polymer structure of claim 10, wherein the polymer binder is PVDF-HFP or polydimethylsiloxane (PDMS).

13. The method of forming the electroactive polymer structure of claim 10, wherein a concentration of the ionic liquid in the polymer dielectric layer is between 30% and 150%.

14. The method of forming the electroactive polymer structure of claim 10, further comprising laminating the first electrode, the polymer dielectric layer, and the second electrode.

15. The method of forming the electroactive polymer structure of claim 10, wherein the ionic liquid is 1-ethyl-3-methylimidaxolium tetrafluoroborate (EMI-BF4) or 1-butyl-3-methyl-imidazolium bis(trifluoromethanesulfonyl)imide (BMI-TFSI).

16. The method of forming the electroactive polymer structure of claim 10, wherein a concentration of the ionic liquid in the polymer dielectric layer is between 30% and 200%.

17. An electroactive polymer structure, comprising:
    a first flexible electrode structure including:
        a first top flexible electrode,
        a first polymer dielectric layer with ionic liquid on top of the first top flexible electrode, and
        a first bottom flexible electrode on top of the first polymer dielectric layer; and
    a second flexible electrode structure including:
        a second top flexible electrode,
        a second polymer dielectric layer with ionic liquid on top of the second top flexible electrode, and
        a second bottom flexible electrode on top of the second polymer dielectric layer, wherein the first top flexible electrode is connected to the second bottom flexible electrode through a first via and the second top flexible electrode is connected to the first bottom flexible electrode through a second via, and wherein the electroactive polymer structure deforms into an "S" shape when a bias is applied.

18. The electroactive polymer structure of claim 17, wherein the first polymer dielectric layer and the second polymer dielectric layer have a different concentration of ionic liquid.

19. The electroactive polymer structure of claim 17, wherein the first polymer dielectric layer and the second polymer dielectric layer have the same concentration of ionic liquid.

20. The electroactive polymer structure of claim 17, wherein the polymer dielectric layer is formed of a solution mixture of poly(vinylidene fluoride-co-hexafluoropropene) (PVDF-HFP) and ionic liquid.

\* \* \* \* \*